US012143126B2

(12) United States Patent
Kinyua et al.

(10) Patent No.: US 12,143,126 B2
(45) Date of Patent: *Nov. 12, 2024

(54) ANALOG TO DIGITAL CONVERTER WITH VCO-BASED AND PIPELINED QUANTIZERS

(71) Applicant: Taiwan Semiconductor Manufacturing Company, Ltd., Hsinchu (TW)

(72) Inventors: Martin Kinyua, Cedar Park, TX (US); Eric Soenen, Austin, TX (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 167 days.

This patent is subject to a terminal disclaimer.

(21) Appl. No.: 17/876,761

(22) Filed: Jul. 29, 2022

(65) Prior Publication Data

US 2022/0368340 A1 Nov. 17, 2022

Related U.S. Application Data

(63) Continuation of application No. 17/181,381, filed on Feb. 22, 2021, now Pat. No. 11,438,007, which is a
(Continued)

(51) Int. Cl.
*H03M 3/00* (2006.01)
*H03K 3/03* (2006.01)

(52) U.S. Cl.
CPC .......... *H03M 3/368* (2013.01); *H03K 3/0315* (2013.01); *H03M 3/412* (2013.01); *H03M 3/464* (2013.01)

(58) Field of Classification Search
CPC ...... H03M 3/462; H03M 3/422; H03M 3/464; H03M 3/412; H03M 3/368; H03M 1/12; H03M 1/164
See application file for complete search history.

(56) References Cited

U.S. PATENT DOCUMENTS 5,005,016 A 4/1991 Schmidt et al.
5,557,682 A 9/1996 Warner et al.
(Continued)

FOREIGN PATENT DOCUMENTS

CN 105391450 A 3/2016
CN 109889203 A 6/2019
TW I554040 B 10/2016

*Primary Examiner* — Lam T Mai
(74) *Attorney, Agent, or Firm* — MERCHANT & GOULD P.C.

(57) ABSTRACT

An analog-to-digital converter ("ADC") includes an input terminal configured to receive an analog input signal. A first ADC circuit is coupled to the input terminal and includes a VCO. The first ADC circuit is configured to output a first digital signal in a frequency domain based on the analog input signal. The first digital signal includes an error component. A first DAC is configured to convert the first digital signal to an analog output signal. A first summation circuit is configured to receive the analog output signal, the analog input signal, and a loop filtered version of the analog input signal and extract the error component, and output a negative of the error component. A second ADC circuit is configured to convert the negative of the error component to a digital error signal. A second summation circuit is configured to receive the first digital signal and the digital error signal, and to output a digital output signal corresponding to the analog input at an output terminal.

20 Claims, 5 Drawing Sheets

Related U.S. Application Data continuation of application No. 16/835,616, filed on Mar. 31, 2020, now Pat. No. 10,931,299.

(56) References Cited

U.S. PATENT DOCUMENTS

| | | |
|---|---|---|
| 7,333,041 B2 | 2/2008 | Gaggl et al. |
| 9,397,692 B1 * | 7/2016 | Zanbaghi ............... H03M 3/438 |
| 9,419,642 B1 * | 8/2016 | Nguyen ................... H03M 3/42 |
| 9,584,146 B2 * | 2/2017 | Op ....................... H03M 1/1038 |
| 9,614,510 B2 | 4/2017 | Srinivasan et al. |
| 10,171,102 B1 * | 1/2019 | Shibata ................... H03M 3/30 |
| 10,208,371 B2 | 2/2019 | Misra et al. |
| 10,404,270 B2 | 9/2019 | Na et al. |
| 10,432,210 B1 * | 10/2019 | Yendluri ............. H03M 1/1245 |
| 10,931,299 B1 | 2/2021 | Kinyua et al. |
| 2005/0083220 A1 * | 4/2005 | Siferd ................... H03M 3/344 |
| | | 341/143 |
| 2005/0093726 A1 | 5/2005 | Hezar et al. |
| 2005/0275577 A1 * | 12/2005 | Bjornsen ................. H03M 3/46 |
| | | 341/155 |
| 2008/0062026 A1 | 3/2008 | Melanson |
| 2012/0326906 A1 | 12/2012 | Haroun et al. |
| 2013/0009795 A1 * | 1/2013 | Soenen ................. H03H 17/00 |
| | | 341/110 |
| 2013/0021182 A1 | 1/2013 | Mishra et al. |
| 2013/0106630 A1 * | 5/2013 | Wong ...................... H03M 1/46 |
| | | 341/110 |
| 2014/0368368 A1 | 12/2014 | Koli |
| 2015/0303885 A1 | 10/2015 | Kinyua et al. |
| 2016/0065232 A1 * | 3/2016 | Dagher ................. H03M 3/458 |
| | | 341/158 |
| 2016/0204751 A1 * | 7/2016 | Kinyua ................... H03M 1/12 |
| | | 330/251 |
| 2017/0077937 A1 | 3/2017 | Shu |
| 2017/0187387 A1 | 6/2017 | Srinivasan et al. |
| 2019/0348996 A1 | 11/2019 | Rajaee et al. |
| 2020/0083794 A1 | 3/2020 | Bhandarkar et al. |

* cited by examiner

ANALOG TO DIGITAL CONVERTER WITH VCO-BASED AND PIPELINED QUANTIZERS

CROSS-REFERENCE

This application is a continuation of U.S. patent application Ser. No. 17/181,381, filed on Feb. 22, 2021, which is a continuation of U.S. patent application Ser. No. 16/835,616, filed on Mar. 31, 2020, now U.S. Pat. No. 10,931,299, which is in incorporated by reference in its entirety.

BACKGROUND

Analog-to-digital converters ("ADC" or "A/D") are used in a variety of applications in order to convert a sampled analog signal into a digital signal. There are a variety of ADC architectures, such as pipelined, flash, Sigma-Delta, successive approximation register ("SAR"), etc. A pipelined, or subranging, ADC uses two or more steps of subranging. A coarse conversion of an analog input voltage to a coarse digital value is done, then the coarse digital value is converted back to an analog signal with a digital to analog converter (DAC). The coarse value is compared to the input voltage with an analog comparator, and the difference, or residue, is then converted finer and the results are combined. A successive-approximation ADC uses a comparator to successively narrow a range that contains the input voltage. At each successive step, the converter compares the input voltage to the output of a DAC that might represent the midpoint of a selected voltage range. At each step in this process, the approximation is stored in a successive approximation register (SAR). The steps are continued until the desired resolution is reached.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
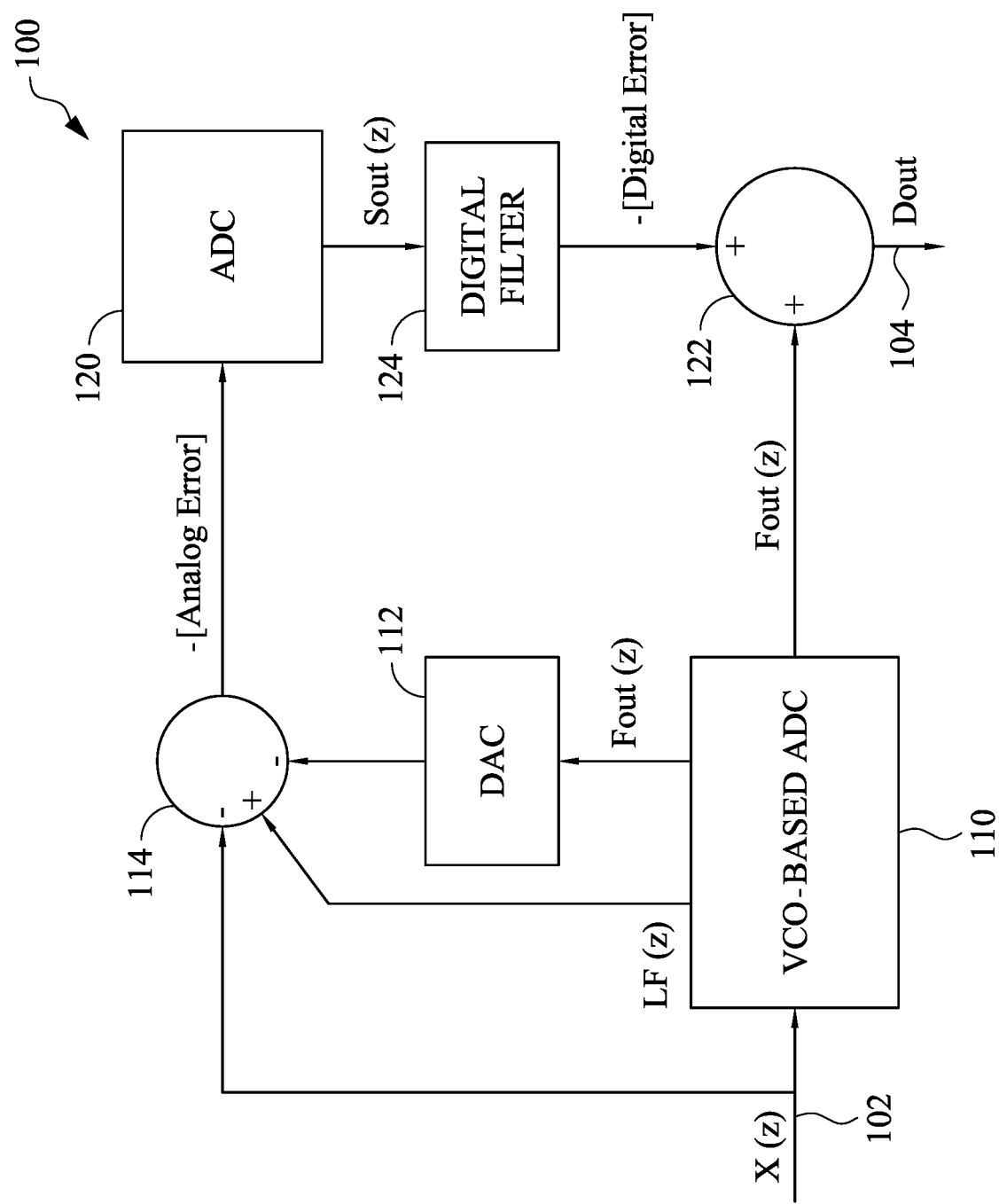
FIG. 1 is a block diagram illustrating aspects of an analog-to-digital converter ("ADC") system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Analog-to-digital converters ("ADC" or "A/D") convert an analog signal into a digital signal. Typical ADC arrangements, such as pipelined, flash, Delta-Sigma, successive approximation register ("SAR"), etc., for certain applications can use too much silicon area, consume too much power, and thus can be too expensive. Moreover, with some known ADC methods, it can be difficult to attain a sufficiently high signal to noise ratio (SNR) and conversion bandwidth in low voltage and low power consumption deep submicron processes.

For instance, some Delta-Sigma ADC methods are limited in conversion bandwidth. Further, some ADCs employing voltage controlled oscillators (VCO) may be limited by VCO quantizer non-linearity resulting from the VCO voltage-to-frequency tuning curve non-linearity. Moreover, to suppress harmonic distortion associated with the VCO quantizer, a higher order loop filter may be required to meet a required quantization noise reduction. This could lead to higher power consumption and/or instability issues.

In accordance with aspects of the present disclosure, a cascaded VCO-Based Delta-Sigma ADC is provided that is configured to cancel or remove nonlinearity of the output signal introduced by VCO quantizer nonlinearity. A VCO-Based Delta-Sigma ADC loop is combined with a forward path quantizer, combining advantages of both ADC technologies. For instance, a VCO has inherent first order noise shaping of its quantization noise.

FIG. 1 is a block diagram illustrating an example of an ADC system 100 in accordance with disclosed embodiments. In general, the ADC system 100 has an input terminal 102 configured to receive an analog input signal X(z). A first ADC stage includes a first ADC circuit 110 coupled to the input terminal. As will be discussed further below, the first ADC circuit 110 includes a VCO and is configured to output a first digital signal Fout(z) in a frequency domain based on the analog input signal X(z). The first digital signal Fout(z) output by the first ADC 110 has an error component that includes a VCO quantization error Qk(z) and VCO harmonic distortion HDvco. Accordingly, the error component of the first digital signal Fout(z) is expressed herein as Qk(z)+HDvco.

A first digital-to-analog converter (DAC) 112 receives the first digital signal Fout(z), and converts the first digital signal Fout(z) to an analog output signal that is input to a first summation circuit 114 along with the analog input signal X(z) and a loop filter output analog signal LF(z) to extract the error component and output a negative of the error component. A second ADC circuit 120 converts the negative of the error component to a digital error signal Sout(z) that is output to a second summation circuit 122 that also receives the first digital signal Fout(z). In some examples, the output of the second ADC circuit 120 is filtered by a digital filter 124. The second summation circuit 122 removes the error component from the first digital signal, and outputs a digital output signal Dout corresponding to the analog input at an output terminal 104.

Figure 2:
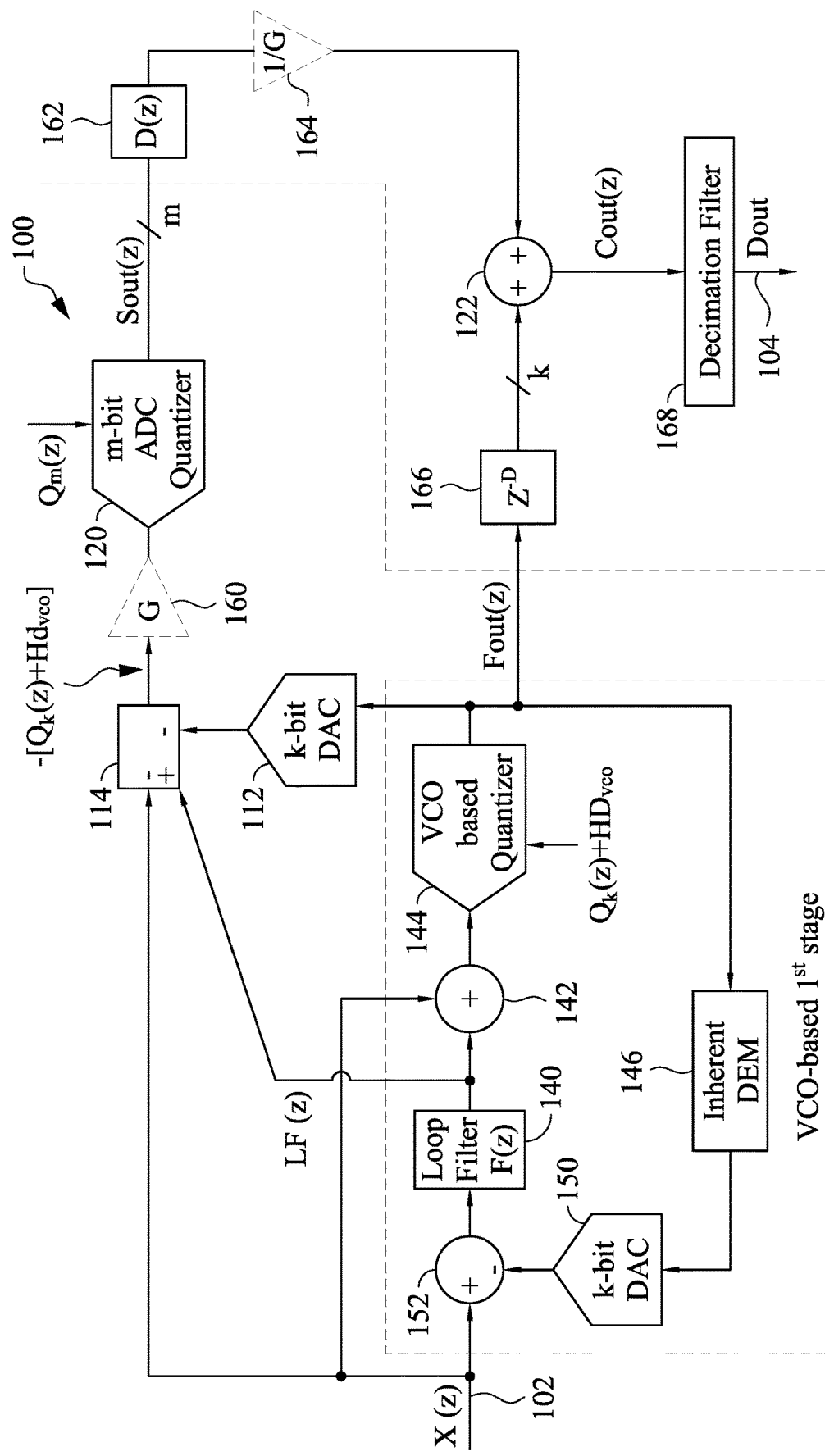
FIG. 2 is a block diagram illustrating further aspects of an example of the ADC system of FIG. 1 in accordance with some embodiments.

FIG. 2 illustrates further aspects of the ADC 100. As shown in FIG. 2, the first ADC circuit 110 of the ADC 100 is a Delta-Sigma ADC configured to encode the analog input voltage X(z) into a stream of pulses. The digital output Fout(z) is passed through a DAC 150 and the resulting analog signal is subtracted from the analog input signal X(z) at a summation block 152 in a negative feedback configuration. In the illustrated example, the output signal Fout(z) is a k-bit digital signal, and thus the DAC 150 is a k-bit DAC.

The output of the summation block 152 is received by a loop filter 140, which provides an analog output LF(z) to a summation block 142 and also to the summation block 114. The analog output of the summation block 142 is input to a VCO based quantizer 144, which converts the filtered analog signal to the k-bit digital output signal Fout(z) in the frequency domain. The first DAC 112 receives the first digital signal Fout(z), which includes the error component Qk(z)+HDvco. The DAC 112 converts the first digital signal Fout(z) to an analog output signal that is input to the summation circuit 114 along with the analog input signal X(z) and the output LF(z) of the loop filter 140 to extract the error component Qk(z)+HDvco and output the negative of the error component −[Qk(z)+HDvco].

The first digital signal Fout(z) output of the VCO based quantizer 144 is shifted as represented by an inherent dynamic element matching (DEM) block 146. For a VCO based ADC such as the ADC 110 shown in FIG. 2, DAC elements from the DAC 150 are naturally rotated at a rate related to the speed of the VCO center frequency. This rotation of DAC elements also arises due to the monotonic progression of pulse edges along the VCO's ring oscillator. The VCO based quantizer 144 therefore dynamically shuffles through delay stages in a "barrel shift" fashion (i.e. the order of the bits of the digital words output by the DAC 150 are shifted or rotated) as the edges in each sampling period progress. The corresponding DAC elements are therefore also scrambled in the barrel-shift fashion by the inherent DEM 146 due to the bit-wise connection to the VCO based quantizer 144.

As noted above, the summation block 114 extracts the error component Qk(z)+HDvco of the first digital output signal Fout(z), and outputs the negative of the error component −[Qk(z)+HDvco]. The negative of the analog error component −[Qk(z)+HDvco] is optionally amplified by an amplifier 160 that applies a gain factor G, and outputs the amplified analog error signal −[Qk(z)+HDvco] to the second ADC 120. In some embodiments, the second ADC 120 provides the digital error component Sout(z) as an m-bit digital output. In the illustrated example, m>k. The m-bit error signal Sout(z) is filtered by a digital filter 162 and output to an amplifier 164 that applies the inverse of the gain factor 1/G to remove the gain factor from the digital error signal Sout(z). The filtered digital error signal Sout(z) is received by a summation block 122, along with the first digital signal Fout(z). The first digital signal Fout(z) may be applied to one or more digital delay elements 166 to align the k-bit first digital signal Sout(z) and the m-bit digital error signal Sout(z). The digital error signal Sout(z) is removed from the first digital signal Fout(z) at the summation block 122, and output as an intermediate converted digital output signal Cout(z). The intermediate converted digital output signal Cout(z) is applied to a decimation filter 168, which outputs the final digital output signal Dout at the output terminal 104.

The first digital output signal Fout(z) in the frequency domain from the first ADC 110 may be expressed as shown in equation [1] below.

$$Fout(z)=STF(z)X(z)+NTF(z)[Qk(z)+HDvco]; \quad [1]$$

Where X(z) is the analog input signal, Qk(z) is the quantization error of the first ADC 110, HDvco is the harmonic distortion from the VCO 144 of the first ADC 110, and SFT(z) and NTF(z) are signal transfer and noise transfer functions, respectively, of the loop filter 140.

The digital error signal Sout(z) output by the second ADC 120 may be expressed as shown in equation [2] shown below.

$$Sout(z)=z^{-D}[-Qk(z)-HDvco+Qm(z)]; \quad [2]$$

Where $z^{-D}$ is the number of clock delays (i.e. "D" clock cycle delay) imposed by the second ADC 120, and Qm(z) is the quantization error of the second ADC 120.

Further, the intermediate converted digital output signal Cout(z) may be expressed as shown in equation [3] below.

$$Cout(z)=z^{-D}Fout(z)+Sout(z)D(z); \quad [3]$$

Where D(z) is a filter transfer function of the digital filter 162. Substituting equations [1] and [2] into equation [3] results in equations [4] and [5] as follows.

$$Cout(z)=z^{-D}STF(z)X(z)+z^{-D}NTF(z)[Qk(z)+HDvco]-z^{-D}D(z)[Qk(z)+HDvco]+z^{-D}D(z)Qm(z); \quad [4];$$

and $$Cout(z)=z^{-D}STF(z)X(z)+z^{-D}(Qk(z)+HDvco)[NTF(z)-D(z)]+z^{-D}D(z)Qm(z); \quad [5]$$

If the digital filter function D(z) of the filter 162 in equation [5] is made identical to the noise transfer function NTF(z), the noise transfer function is removed from the intermediate converted digital output Cout(z), and it becomes $$Cout(z)=z^{-D}STF(z)X(z)+D(z)Qm(z); \quad [6]$$

Thus, in equation [6], the VCO quantizer non-linearity HDvco is cancelled and does not appear at the intermediate converted digital output signal, and therefor is not included in the output signal Dout.

Figure 3:
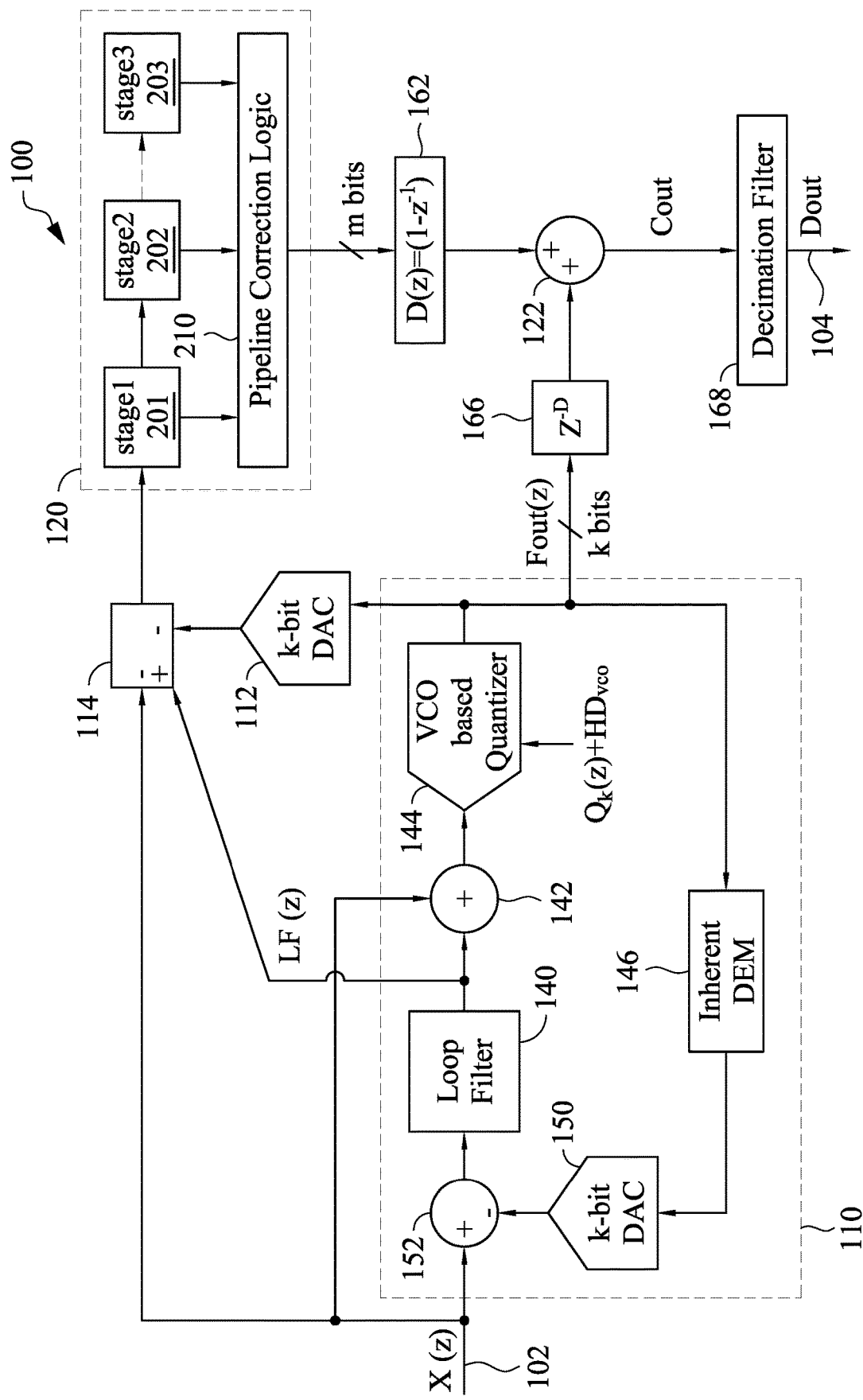
FIG. 3 is a block diagram illustrating further aspects of an example of the ADC system of FIG. 1 in accordance with some embodiments.

FIG. 3 illustrates further aspects of an example of the ADC system 100. The example shown in FIG. 3 includes the Delta-Sigma ADC circuit 110 as shown in FIG. 2, which is configured to encode the analog input voltage X(z) into the frequency domain as a stream of pulses. The digital output Fout(z) of the VCO based quantizer 144 is received by the DAC 150, which outputs an analog signal that is subtracted from the analog input signal X(z) at the summation block 152. As with the example of FIG. 2, the output signal Fout(z) is a k-bit digital signal. The loop filter 140 receives the output of the summation block 152 and outputs a filtered analog signal to the summation block 142 and also to the summation block 114. The summation block 114 extracts the error component Qk(z)+HDvco of the first digital output signal Fout(z), and outputs the negative of the error component −[Qk(z)+HDvco] to the second ADC 120.

In the example of FIG. 3, the second ADC circuit 120 is a pipelined ADC including a first stage 201, a second stage 202 and a third stage 203. Other embodiments may employ ADCs having more or fewer pipelined stages. The illustrated pipelined ADC 120 uses three steps of sub-ranging by the respective ADC stages 201, 202, 203. The first ADC stage 201 does first conversion of the analog error signal output by the summation block 114 to a coarse digital value. The coarse digital value is converted back to an analog signal with a DAC and is compared to the original analog error signal. The difference between the first converted value, or residue, is then converted to finer and finer outputs by the successive second and third stages 202, 203. The results are combined by a pipeline correction block 210, and the m-bit digital signal is output to the digital filter 162. If the analog error signal $-[Qk(z)+HDvco]$ output by the summation block 114 is amplified (not shown in FIG. 3), the digital filter 162 may include an inverse of the gain factor G applied.

As noted above, in some examples the digital filter 162 has its digital filter function $D(z)$ made identical to the noise transfer function $NTF(z)$ of the first digital output signal $Fout(z)$ to cancel the VCO quantizer non-linearity HDvco from the converted digital output signal $Cout(z)$. The output of the digital filter 162 is provided to the summation block 122, which also receives the first digital output signal in the digital domain $Fout(z)$, which is delayed by the delay element 166 to align with the output of the digital filter 162.

The second summation circuit 122 removes the remaining error component from the first digital signal $Fout(z)$, and the intermediate digital output signal $Cout(z)$ is received by the decimation filter 168, which outputs the digital output signal Dout corresponding to the analog input at the output terminal 104.

Figure 4:
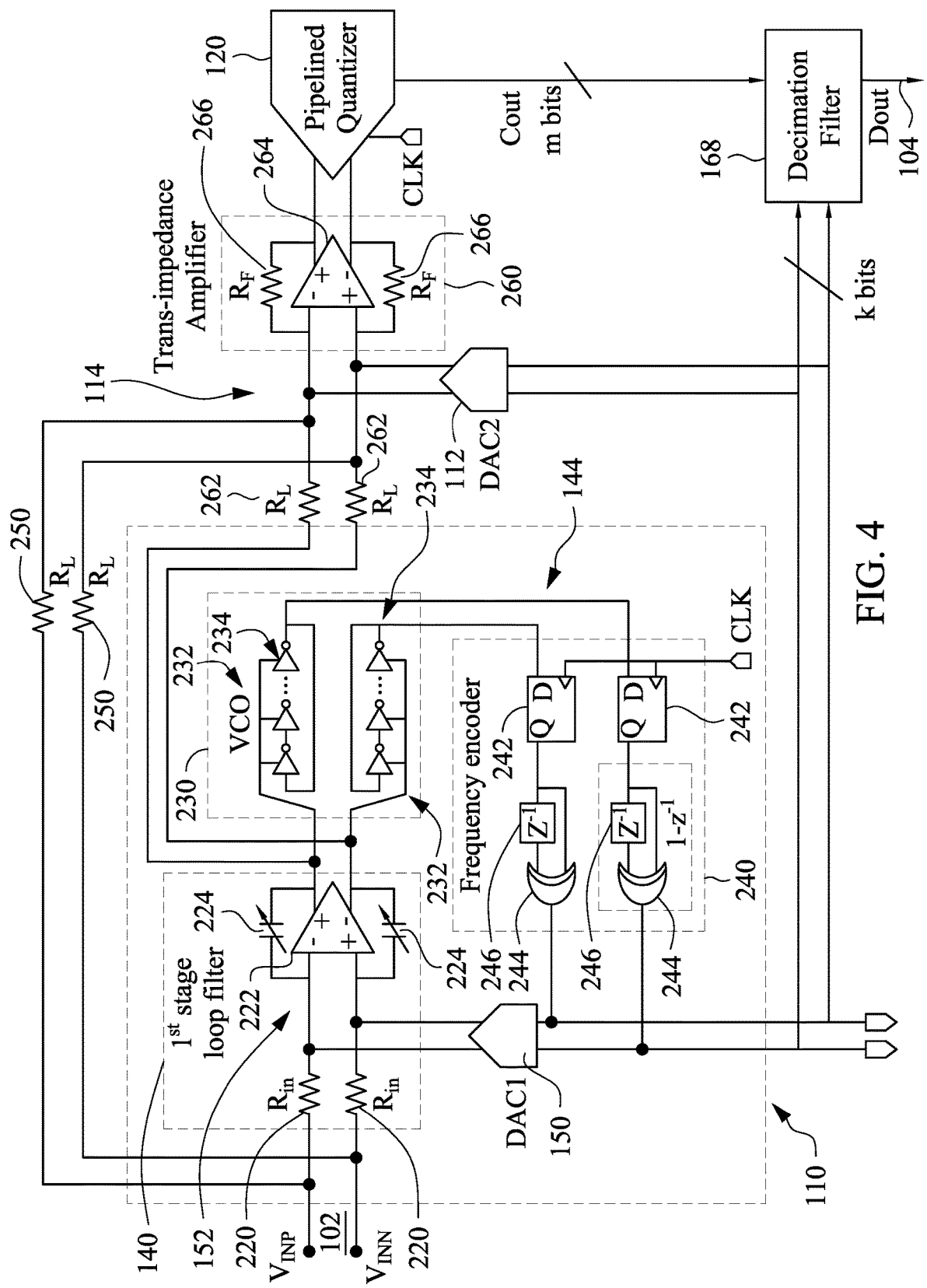
FIG. 4 is a circuit diagram illustrating further aspects of an example of the ADC system of FIG. 1 in accordance with some embodiments.

FIG. 4 illustrates further aspects of the VCO based Delta-Sigma ADC 110 in accordance with some embodiments. The analog input signal $X(z)$ is received at the input terminal 102 as differential analog voltage signals Vinp, Vinn. The loop filter 140 includes input resistors 220 that receive the differential analog input signals Vinp, Vinn, and an operational amplifier 222. The operational amplifier 222 is configured as an integrator with differential outputs that are fed back to the operational amplifier inputs via variable tuning capacitors 224 to account for Process, Voltage and Temperature (PVT) variations.

The VCO based quantizer 144 includes a VCO 230 that receives the differential outputs of the operational amplifier 222. The VCO 230 generates an oscillating signal with a frequency controlled by the voltage signal received from the loop filter 140. The VCO 230 includes ring oscillators 232 that each have a series of inverters 234 connected in cascade. Oscillation is obtained if a phase shift of 180 degrees in total is achieved to form a positive feedback. Each inverter 234, also referred to as a delay cell, has an associated intrinsic delay, and the sum of the intrinsic delays of all of the inverters 234 makes the circuit oscillate at a certain frequency. In embodiments where a differential control signal is used, an even or odd number of the inverters 234 may be used to achieve oscillation. In single-ended embodiments where a single input signal is received, an odd number of inverters 234 is required to achieve oscillation. The use of the inverters 234 in the ring oscillator circuits 232 facilitates implementation in deep nano-scale processes.

The output of the VCO 230 is received by a frequency encoder 240. More specifically, the VCO outputs differential outputs based on the differential signals received from the operational amplifier 222. The differential outputs of the VCO 230 are received at the D inputs of respective flip-flops 242. The flip-flops 242 provide outputs Q based on the output signals of the VCO 230 and a clock signal CLK. The frequency encoder 240 further includes exclusive OR (XOR) gates 244 that respectively receive the Q outputs of the flip-flops 242. One input of the XOR gates 244 directly receives the Q output from its respective flip-flop 242, while the other input receives the Q input via a delay element 246. The frequency domain signal output by the frequency encoder 240 is received by the DAC 150, which outputs corresponding differential analog signals to the loop filter 140, where they are subtracted from the differential analog input signals Vinp, Vinn at the summation point 152 in a negative feedback configuration. The k-bit frequency digital signal is further output to the decimation filter 168, which processes the intermediate digital signal $Cout(z)$ to produce the digital output signal Dout.

The differential outputs of the loop filter 140 are received by a transimpedance amplifier 260 through resistors 262. The differential analog output signal from the DAC 112 is also received at the inputs of a transimpedance amplifier 260, along with the differential analog input signals Vinp, Vinn via load resistors 250. Thus, as noted above, the analog input signals Vinp, Vinn, the filtered version of the analog input signals $LF(z)$ as output by the loop filter 140, and the analog version of the first ADC 110 output as converted by the DAC 112 are combined at the summation point 114 to output the negative of the error component of the VCO based ADC 110 output. The transimpedance amplifier 260 is implemented by an operational amplifier 264 configured with differential outputs fed back to the operational amplifier inputs through feedback resistors 266. The differential outputs of the operational amplifier 264 are further provided to the second ADC 120, which as noted above, is a pipelined ADC in some examples.

Figure 5:
FIG. 5 is a flow diagram illustrating an example of a method in accordance with some embodiments.

FIG. 5 is a flow diagram illustrating aspects of an ADC method 300 in accordance with disclosed examples. At a step 310, an analog input voltage $X(z)$ is received at an input terminal 102. The analog input signal is converted to a first digital signal $Fout(z)$ in a frequency domain by a first ADC circuit 110 at step 312. In some embodiments, the first ADC circuit is a Delta-Sigma ADC. At step 314, the first digital signal is converted to an analog output signal by a DAC circuit 112. An error component is extracted from the analog output signal at step 316, for example, by comparing the analog output signal to the analog input signal by the summation circuit 114. A negative of the error component is converted to a second digital signal by the second ADC circuit 120 at step 318. In some embodiments, the second ADC circuit is a pipelined ADC. At step 320, the second digital signal is filtered by a digital filter 124 using a digital filter function $D(z)$ matching a noise transfer function $NTF(z)$ of the first digital signal. The first digital signal and the second digital signal are combined by a summation circuit 122 at step 322, and a digital output signal Dout corresponding to the analog input signal $X(z)$ is output at step 324.

Disclosed embodiments thus provide an ADC that includes an input terminal configured to receive an analog input signal. A first ADC circuit is coupled to the input terminal and includes a VCO. The first ADC circuit is configured to output a first digital signal in a frequency domain based on the analog input signal. The first digital signal includes an error component. A first DAC is configured to convert the first digital signal to an analog output signal. A first summation circuit is configured to receive the analog output signal, the analog input signal, and a filtered version of the analog input signal and extract the error component, and output a negative of the error component. A second ADC circuit is configured to convert the negative of the error component to a digital error signal. A second summation circuit is configured to receive the first digital signal and the digital error signal, and to output a digital output signal corresponding to the analog input at an output terminal.

Further disclosed embodiments includes an ADC that includes an input terminal configured to receive an analog input signal, with a VCO-based Delta-Sigma ADC circuit coupled to the input terminal and configured to output a first digital signal in a frequency domain based on the analog input signal. The first digital signal includes a noise transfer function. A DAC is configured to convert the first digital signal to an analog output signal, and a first summation circuit is configured to receive the analog output signal and the analog input signal. A pipelined ADC circuit is configured to convert an output of the first summation circuit to a second digital signal. A digital filter is coupled to receive the second digital signal output by the pipelined ADC circuit. The digital filter has a digital filter function matching the noise transfer function to remove harmonic distortion from the first digital signal.

In another disclosed embodiment, a method includes converting an analog input signal to a first digital signal in a frequency domain by a first ADC circuit. The first digital signal is converted to an analog output signal. An error component is extracted from the analog output signal. A negative of the error component is converted to a second digital signal by a second ADC circuit. The second digital signal is filtered using a digital filter function matching a noise transfer function of the first digital signal. The first digital signal and the second digital signal are combined by a summation circuit to output a digital output signal corresponding to the analog input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter ("ADC"), comprising:
   an input terminal configured to receive an analog input signal;
   a first ADC circuit configured to output a digital signal in the frequency domain corresponding to the analog input signal including a voltage controlled oscillator (VCO);
   a digital-to-analog converter (DAC) connected to an output terminal of the first ADC circuit to receive the first digital signal;
   a summation block connected to the input terminal and an output terminal of the DAC;
   a transimpedance amplifier connected to an output terminal of the summation block;
   a second ADC circuit coupled to an output of the transimpedance amplifier; and
   a digital filter coupled to receive an output of the second ADC circuit, wherein the first digital signal includes a noise transfer function, and wherein the digital filter has a digital filter function matching the noise transfer function to remove harmonic distortion from the first digital signal.

2. The ADC of claim 1, wherein the first ADC circuit includes a Delta-Sigma ADC.

3. The ADC of claim 1, wherein the second ADC circuit includes a pipelined ADC circuit configured to convert the output of the transimpedance amplifier to a second digital signal.

4. The ADC of claim 3, wherein the summation block is a first summation block, and wherein the ADC further comprises a second summation block configured to receive the first digital signal and the second digital signal, and output a digital output signal corresponding to the analog input signal at an output terminal.

5. The ADC of claim 4, further comprising a delay circuit coupled between the first ADC circuit and the second summation circuit.

6. The ADC of claim 1, wherein:
   the first digital signal includes an error component;
   the first summation block is configured to extract the error component and the output of the first summation circuit is a negative of the error component; and
   the second digital signal corresponds to the negative of the error component.

7. The ADC of claim 6, wherein the transimpedance amplifier is configured to apply a first gain factor to the negative of the error component; and wherein the ADC further comprises:
   a second amplifier coupled between the second ADC circuit and the second summation circuit, the second amplifier configured to apply an inverse of the first gain factor to the second digital signal.

8. An analog-to-digital converter ("ADC"), comprising:
   an analog input terminal configured to receive an analog input signal;
   a first summation block having a first input terminal connected to the analog input terminal and a second input terminal;
   a loop filter having a first input terminal connected to an output terminal of the loop filter and a second input terminal connected to the analog input terminal;
   a VCO-based quantizer having an input terminal connected to an output terminal of the second summation block and configured to provide a digital output signal in the frequency domain at an output terminal;
   a first digital-to-analog converter (DAC) having an input connected to the output terminal of the VCO-based quantizer;
   a second DAC having an input connected to the output terminal of the VCO-based quantizer;
   a second summation block having a first input terminal connected to the analog input terminal, a second input terminal connected to an output terminal of the loop filter, and a third input connected to an output of the second DAC;
   a second ADC circuit having an input terminal connected to an output terminal of the second summation block; and
   a third summation block having a first input terminal connected to the output terminal of the VCO-based quantizer, a second input terminal connected to an output terminal of the second ADC circuit, and an output terminal.

9. The ADC of claim 8, further comprising a first ADC circuit configured to output a first digital signal in a frequency domain based on the analog input signal, the first ADC circuit including:
the first summation block;
the loop filter;
the VCO-based quantizer; and
the first DAC; and
wherein the second ADC circuit is configured to convert an output of the first summation block to a second digital signal.

10. The ADC of claim 9, wherein the first digital signal includes a noise transfer function, and wherein the ADC further comprises:
a digital filter coupled to receive the second digital signal output by the second ADC circuit, wherein the digital filter has a digital filter function matching the noise transfer function to remove harmonic distortion from the first digital signal.

11. The ADC of claim 9, wherein the first ADC circuit includes a Delta-Sigma ADC.

12. The ADC of claim 9, wherein the second ADC circuit includes a pipelined ADC.

13. The ADC of claim 9, wherein the first digital signal includes an error component, the first summation block being configured to further receive a filtered version of the analog input signal and extract the error component and output a negative of the error component, and wherein the ADC further comprises:
a second summation circuit configured to receive an output of the digital filter and the first digital signal, and output a digital output signal corresponding to the analog input signal at an output terminal.

14. The ADC of claim 13, further comprising:
a first amplifier coupled between the first summation block and the second ADC circuit, the first amplifier configured to apply a first gain factor to the negative of the error component; and
a second amplifier coupled between the digital filter and the second summation block, the second amplifier configured to apply an inverse of the first gain factor to the second digital signal.

15. The ADC of claim 14, wherein the error component includes a quantization error and a harmonic distortion.

16. An analog-to-digital conversion method, comprising:
receiving an analog input signal;
converting the analog input signal to a first digital signal in a frequency domain, wherein the first digital signal includes an error component;
converting the first digital signal to an analog output signal;
filtering the analog input signal through a loop filter;
extracting the error component by summing the analog input signal with the filtered analog input signal and the analog output signal;
converting a negative of the error component to a digital error signal;
producing a digital output signal corresponding to the analog input signal by summing the first digital signal and the digital error signal.

17. The method of claim 16, wherein converting the analog input signal to the first digital signal in the frequency domain includes applying the analog input signal to a voltage controlled oscillator (VCO).

18. The method of claim 16, further comprising:
applying a first gain factor to the negative of the error component by a transimpedance amplifier; and
applying an inverse of the first gain factor to the digital error signal.

19. The method of claim 16, further comprising delaying the first digital signal before summing the first digital signal and the digital error signal.

20. The method of claim 16, wherein converting the analog input signal to the first digital signal in the frequency domain includes applying the analog input signal to one of a first ADC circuit including a Delta-Sigma ADC or a pipelined ADC.

* * * * *